(12) United States Patent
Reckord

(10) Patent No.: US 10,772,397 B2
(45) Date of Patent: Sep. 15, 2020

(54) JEWELRY WITH FEATURES FROM TOPOGRAPHIC DATA

(71) Applicant: Courtney Reckord, South Burlington, VT (US)

(72) Inventor: Courtney Reckord, South Burlington, VT (US)

( * ) Notice: Subject to any disclaimer, the term of this patent is extended or adjusted under 35 U.S.C. 154(b) by 98 days.

(21) Appl. No.: 16/177,756

(22) Filed: Nov. 1, 2018

(65) Prior Publication Data

US 2019/0125044 A1 May 2, 2019

Related U.S. Application Data

(60) Provisional application No. 62/580,197, filed on Nov. 1, 2017.

(51) Int. Cl.
| | |
|---|---|
| *B22C 7/00* | (2006.01) |
| *B22C 9/00* | (2006.01) |
| *B22C 9/22* | (2006.01) |
| *A44C 15/00* | (2006.01) |
| *A44C 27/00* | (2006.01) |
| *G06T 17/05* | (2011.01) |
| *G06T 19/20* | (2011.01) |
| *A44C 25/00* | (2006.01) |
| *G06F 30/00* | (2020.01) |
| *A44C 5/00* | (2006.01) |
| *A44C 9/00* | (2006.01) |
| *A44C 7/00* | (2006.01) |

(52) U.S. Cl.
CPC ........... *A44C 27/007* (2013.01); *A44C 15/00* (2013.01); *A44C 25/001* (2013.01); *A44C 25/007* (2013.01); *G06F 30/00* (2020.01); *G06T 17/05* (2013.01); *G06T 19/20* (2013.01); *A44C 5/00* (2013.01); *A44C 7/00* (2013.01); *A44C 9/00* (2013.01)

(58) Field of Classification Search
CPC .... B22C 7/00; B22C 9/00; B22C 9/22; A44C 15/00; A44C 27/00
USPC ...................................... 164/6, 45, 47; 63/33
See application file for complete search history.

(56) References Cited

U.S. PATENT DOCUMENTS

| | | | | |
|---|---|---|---|---|
| 2,145,071 | A | * | 1/1939 | Cave ................................... 63/3 |
| 4,557,312 | A | * | 12/1985 | Gonzales .................. B22C 9/02 164/34 |
| 2014/0072781 | A1 | * | 3/2014 | Holc ...................... A44C 25/00 428/195.1 |
| 2015/0103514 | A1 | * | 4/2015 | White ................... B29C 64/135 362/97.4 |

* cited by examiner

*Primary Examiner* — Kevin P Kerns
(74) *Attorney, Agent, or Firm* — Dunkiel Saunders Elliot Raubvogel & Hand; Shawn Gordon

(57) ABSTRACT

Jewelry that includes a topographical feature of a selected geographic location is made by obtaining topographic data for a geographic area around the selected location. The data is then used to create a topographic surface that is representative of the topography of the area and the 3D surface is adjusted for scale, viewpoint, and other features and merged with a template for a piece of jewelry. The resulting merged object is printed and the printed object is cast to produce a piece of jewelry that includes a topographic representation of the selected location.

13 Claims, 23 Drawing Sheets

JEWELRY WITH FEATURES FROM TOPOGRAPHIC DATA

RELATED APPLICATION DATA

This application claims the benefit of U.S. Provisional Application No. 62/580,197 titled "Jewelry from Geographic Data" and filed on Nov. 1, 2017, which is incorporated herein in its entirety.

FIELD OF THE INVENTION

The present invention generally relates to jewelry. In particular, the present invention is directed to a system and method for creating pieces of jewelry based on geographic data from a particular location.

BACKGROUND

Jewelry holds an important place in history and continues to play an integral role in society today. The giving and receiving of precious metals, rare stones, and other forms of jewelry has been the universal sign of love, gratuity and loyalty. Rare stones such as rubies and emeralds can be cut and polished to accent the light that shines through the stones and may subsequently be mounted on a ring or worn as a pendant. Precious metals, such as gold and silver, can also be worn as rings and pendants but also have the additional characteristic of being able to be melted and poured into casts of many different shapes. These characteristics allow these metals to take on many different forms, thus giving jewelry making many more possibilities.

In general, three techniques are known for manufacturing such an article of jewelry: etching, stamping, and casting. Each of these techniques is useful in a particular situation. Casting, for example, can be accomplished in two stages: first, an impression or negative mold is formed by the prototyping machine; and, second, a positive cast or reproduction is made of the original wax object from the negative impression. The term negative refers to the hollow form or mold into which the liquefied casting material is poured. The term positive means the copy or reproduction resulting from filling the negative mold with the substances selected for the specific cast, which are then allowed to harden. Plaster or clay is frequently used for the negative mold, and gold or silver for the positive or final work.

SUMMARY OF THE DISCLOSURE

An exemplary aspect of the present disclosure provides a piece of jewelry with an incorporated topographic representation. The piece of jewelry includes a support structure and a topography structure attached to and supported by the support structure, the topography structure having three dimensions and including three-dimensional features derived from topographic data for a selected geographic location.

In another exemplary aspect of the present disclosure, a piece of jewelry is prepared by a process comprising the steps of selecting a geographic area, preparing a digital three dimensional surface representative of topography of the area, selecting a frame style, framing a first portion of the surface within the frame style, and removing a second portion of the surface, the removed second portion being outside the frame style. The frame style and the first portion of the surface are then merged to form a representation of an object of jewelry, from which the object of jewelry is printed, and the piece of jewelry is cast from the printed object.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DESCRIPTION OF THE DISCLOSURE

Figure 1:
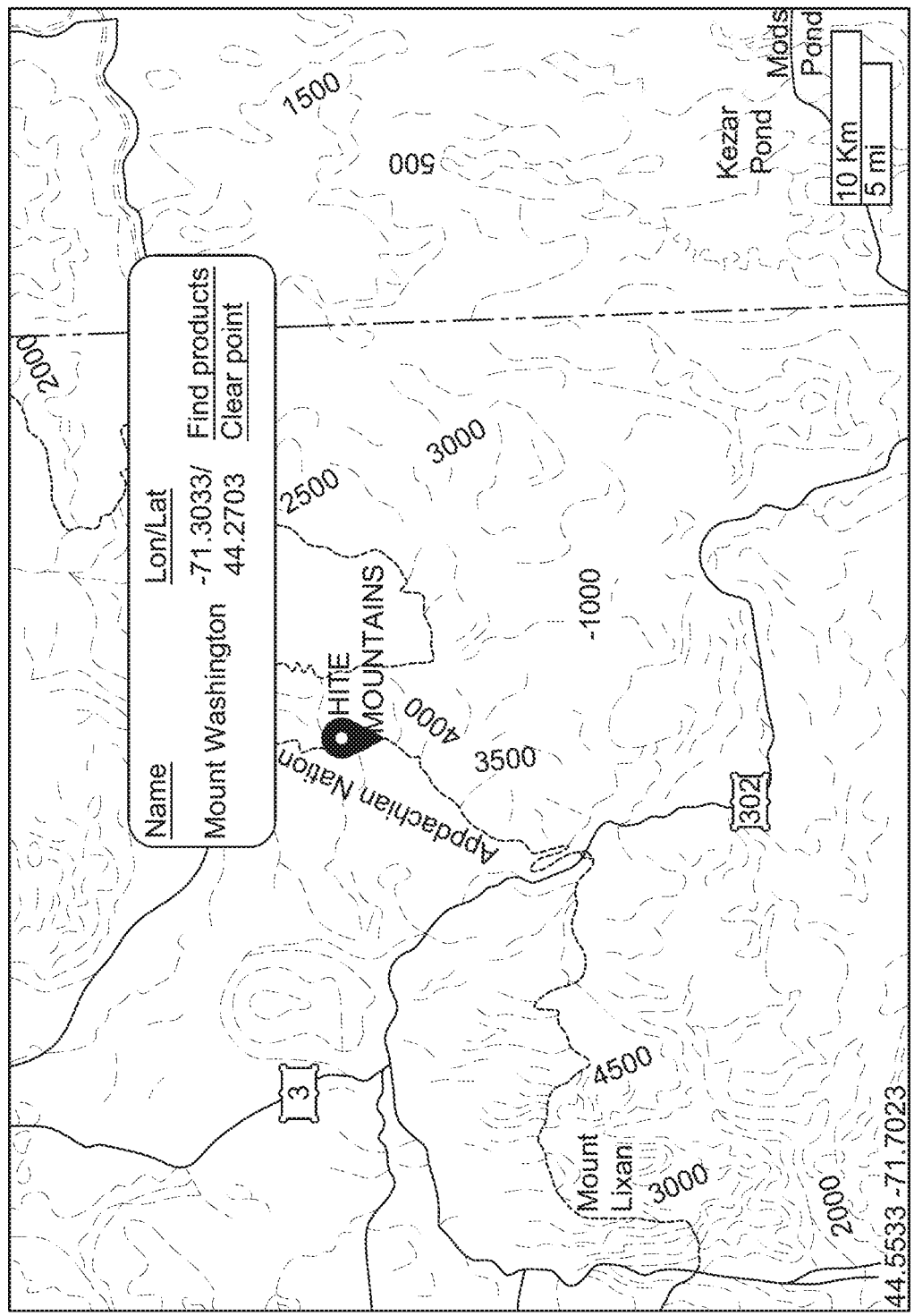
FIG. 1 depicts a representation of a geographic location that may be selected in accordance with the present invention.

As provided herein, jewelry can be made that includes representations of topography from particular geographic locations based on topographic data obtained for that location. The data is used to create a digital 3D surface that is representative of the topography of the location and the surface is conjoined with an appropriate digital object such as a frame or ring surface to produce a digital jewelry object that includes a topographic representation of the location. The digital jewelry object can be printed and then cast into a piece of jewelry.

A variety of jewelry items can be made, including, for example, rings, bracelets, cufflinks, tie tacks, brooches, belts, buckles, earrings, and pendants. For many of these types of jewelry, the geographic feature can be either a topographic representation or a silhouette, in either case generated from geographic and topographic data of the selected location. This allows jewelry to be created that portrays or represents a particular geographic feature of a location chosen by the user, either for aesthetic reasons or because a location has some significance for the wearer of the jewelry.

Once a location is selected, topographic and geographic data for that location, based for example on a latitude and longitude, or a range of latitudes and longitudes that define an area of interest, are obtained. This data can include elevation and contour information, as well as other information related to the landscape such as whether the location includes bodies of water and whether the selected area is sloped, rocky, mountainous, etc. Elevation data, for example, can be obtained for a selected latitude and longitude range from, for example, a website maintained by the U.S. Geological Service (https://apps.nationalmap.gov/download/). From this data, a three dimensional file of a surface representative of the contour or topography of the selected location is created that can be viewed and manipulated (e.g., by altering the size, scale, proportions in one or more dimensions) using an appropriate software program such as Grasshopper 3D in a computer aided design application such as Rhinoceros 3D.

The 3D image file of the surface topography of the selected location can then be rotated, resized, and/or cropped as desired, depending in part on whether a silhouette view or topographic view is to be captured in the item of jewelry and in order to capture a particular view/angle of a desired feature (e.g., mountain range or distinctive peak). A frame for encompassing or supporting the geographic feature is selected. The frame is generally a geometric shape such as a circle, square, or oval, but may be any shape, and is used to outline, encompass, and/or split/crop the surface. For jewelry that will have a topographic view, the frame will preferably contact the entire outer edge of the surface to be depicted, usually by splitting the surface. For jewelry that will have a silhouette view, the frame will preferably contact the lower edge of the depicted surface while a gap is left between the contoured upper portion of the surface and the part of the frame that encompasses the upper portion of the surface. Alternatively, a horizontal contour may be used by taking a slice at sea level, for example, which will result in the shape of an island, lake, or other feature. It will be understood that preferably the frame at this point in the creation of the jewelry is likewise a 3D computer-aided design file.

After additional processing of the frame/surface images that may include adjusting the scale of the frame/surface and making sure that the frame/surface object is closed, the 3D image file of the frame/surface object is exported to an appropriate file format, such as STL, or stereolithography CAD software. The frame/surface object can then be printed by a 3D printer or other suitable method, and then the printed object can be cast in a selected material, such as a metal, by any suitable technique, including by lost wax casting, to produce a piece of jewelry.

Figure 2:
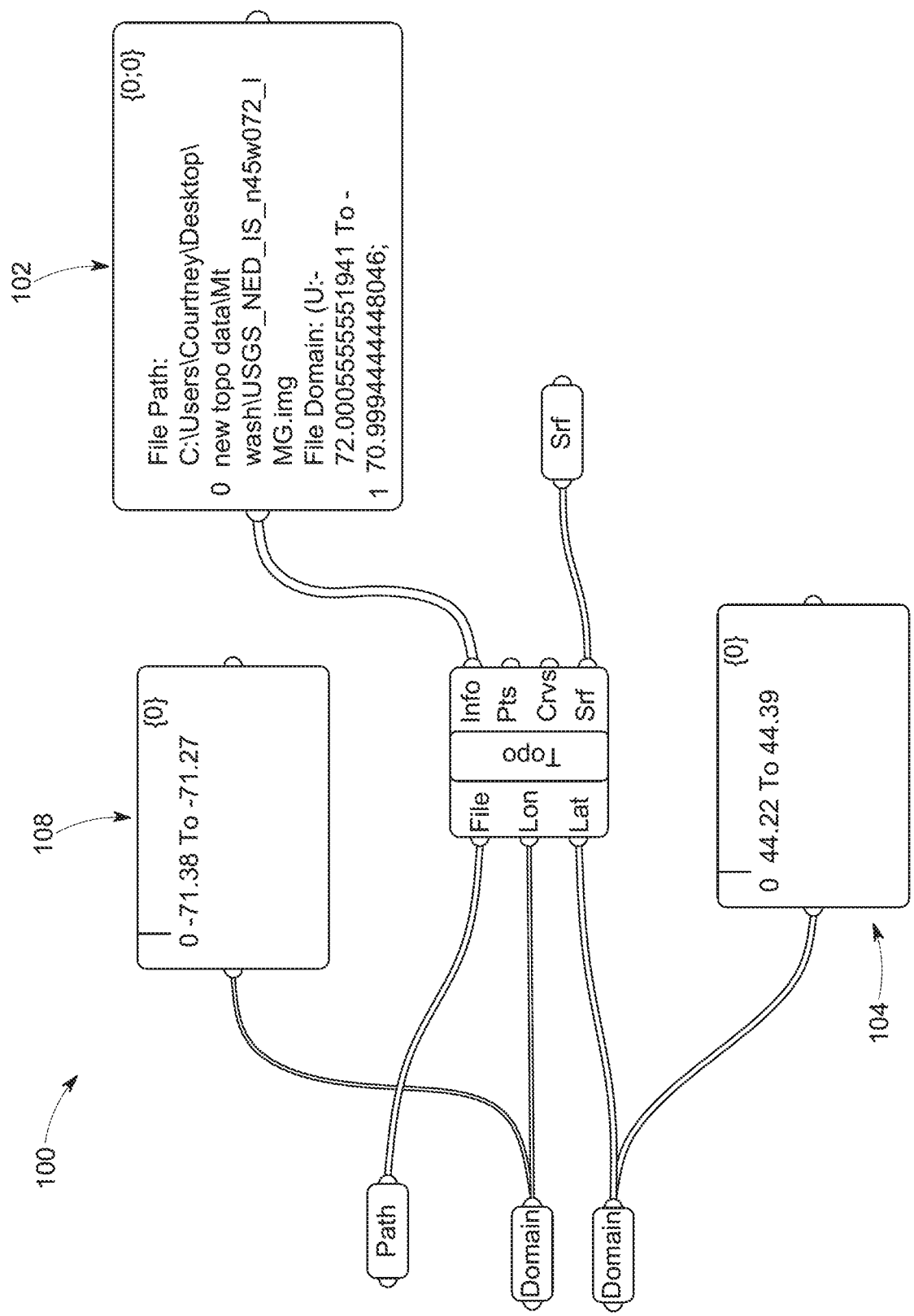
FIG. 2 shows an example of a script used in the preparation of a topographic surface representation of a selected geographic location.

In FIG. 1, a map 10 is shown displaying an area around a selected location of −71.3033 longitude and 44.2703 latitude, which corresponds with Mount Washington in the Presidential Range in the White Mountains. As noted, topographical data for this location is extracted for an area encompassing Mount Washington. Preferably, data associated with ⅓ arc-second Digital Elevation Model (DEM) is used and an image file 100 (shown in FIG. 2) is used. However, it will be understood that data associated with 1 arcsecond, ⅕ arcsecond or other degree DEM may be used, as may be desirable depending on the nature of the topography to be captured. In a 3D image program, such as Grasshopper 3D in Rhinoceros, a script 102 for creating a surface imports the data from image file 100 and a range for the latitude and longitude may be entered for an area for which the geographic feature of the jewelry is to be representative of. Any range may be used, and in the example shown 0.2 degrees for both a latitude range 104 and a longitude range 108 is selected. The adequacy of these ranges may be determined by reference to a map. (In an alternative, an area, such as a rectangular area, may be chosen from a map and the latitude and longitude ranges defining the rectangular area may be used as range 104 and range 108.)

Figure 3:
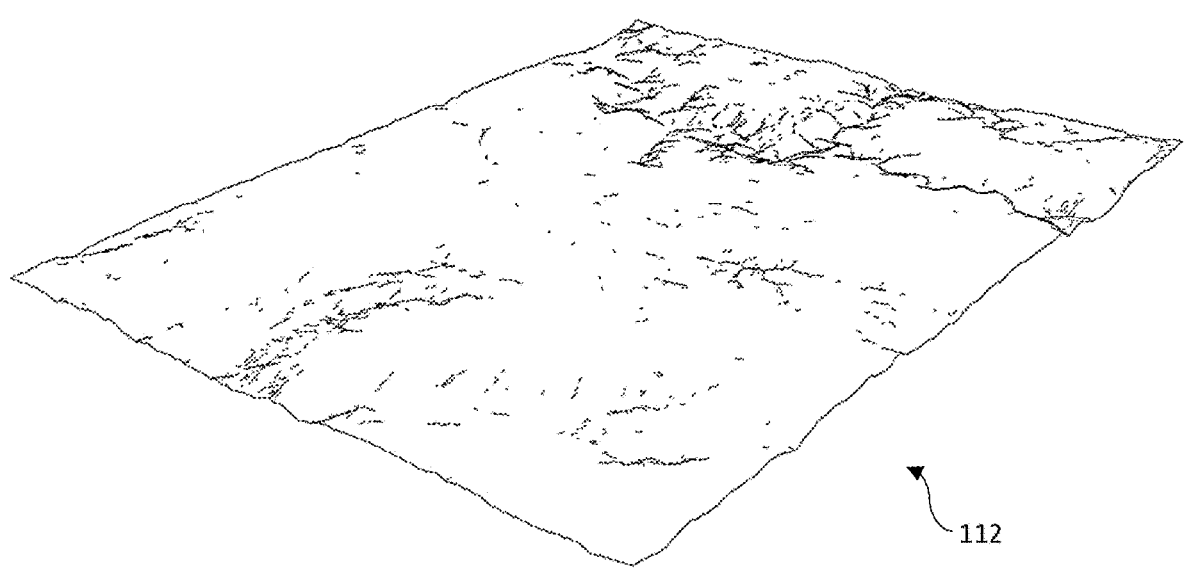
FIG. 3 is an exemplary surface generated in accordance with an embodiment of the present invention.
Figure 4:
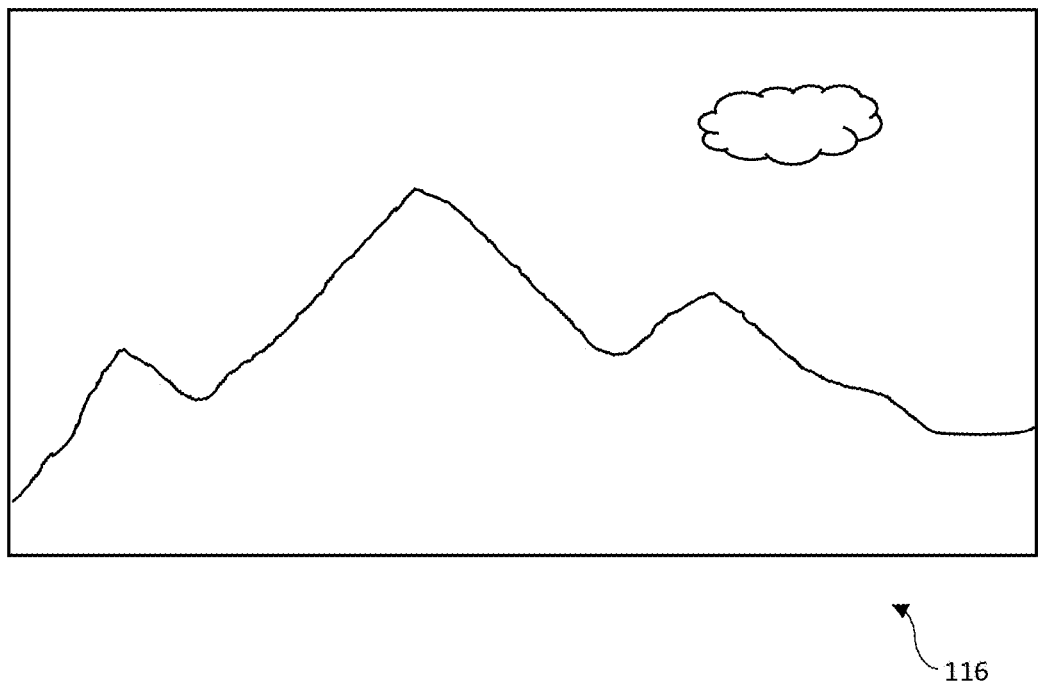
FIG. 4 depicts an image of the selected geographic location from a particular vantage point that may be used during the process described herein.

A topographic surface 112 as shown in FIG. 3 is generated by script 102 as a 3D image file and can be viewed in the 3D image program. Surface 112 may be satisfactory, although it may often be necessary to determine whether the desired topography has been captured. This may be accomplished in any suitable manner, including by rotating surface 112 so that surface 112 is oriented similarly to a photograph 116 (depicted in FIG. 4) of the selected geographic location taken from a perspective of a viewer or observer from a particular vantage point. A portion of the intended area may be missing, which could require an adjustment to latitude range 104 and/or longitude range 108. After any necessary range adjustment is made, surface 112 may be regenerated and viewed again to make sure it captures all desired landscape features.

Figure 5:
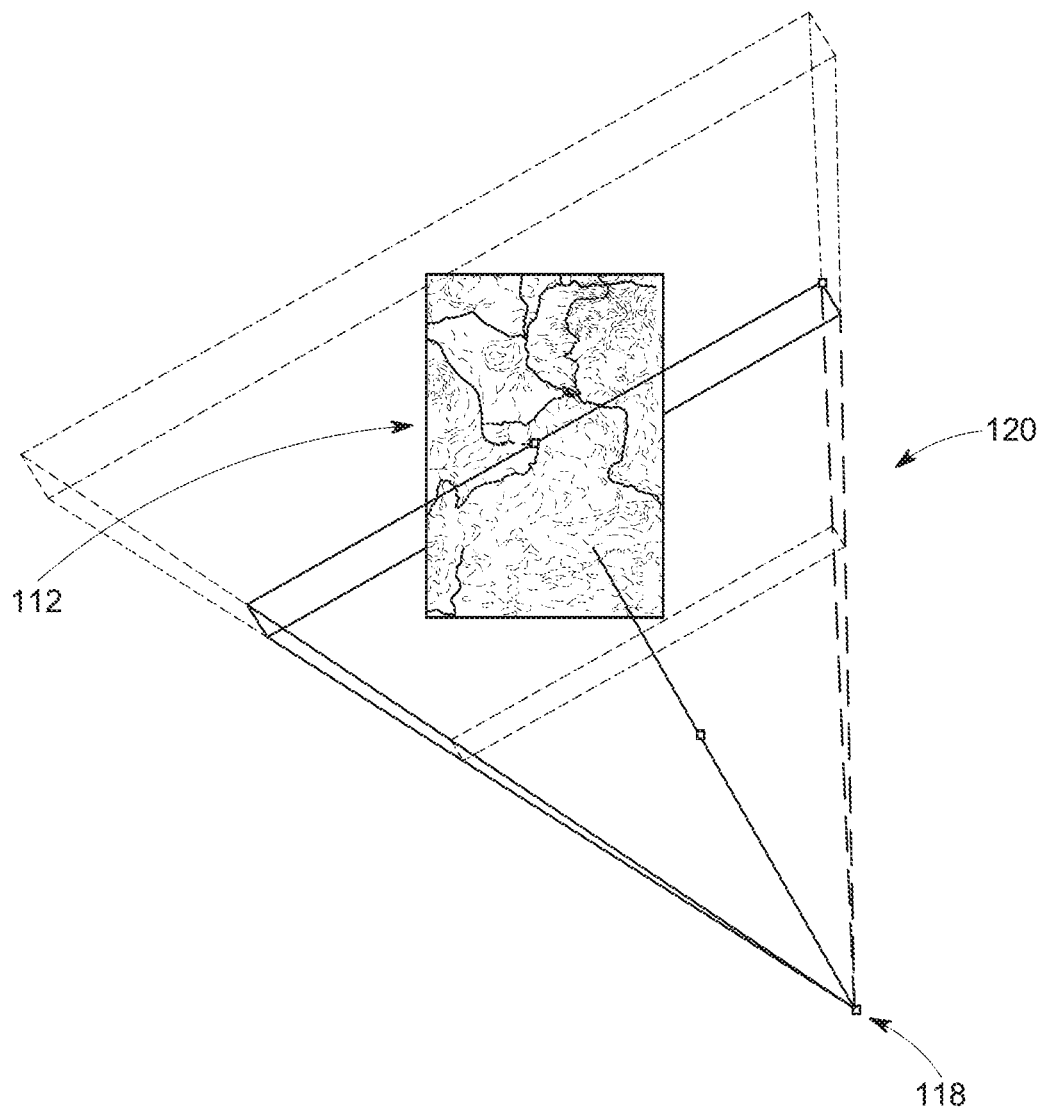
FIG. 5 depicts the surface of FIG. 3 interacting with a camera view function.
Figure 6:
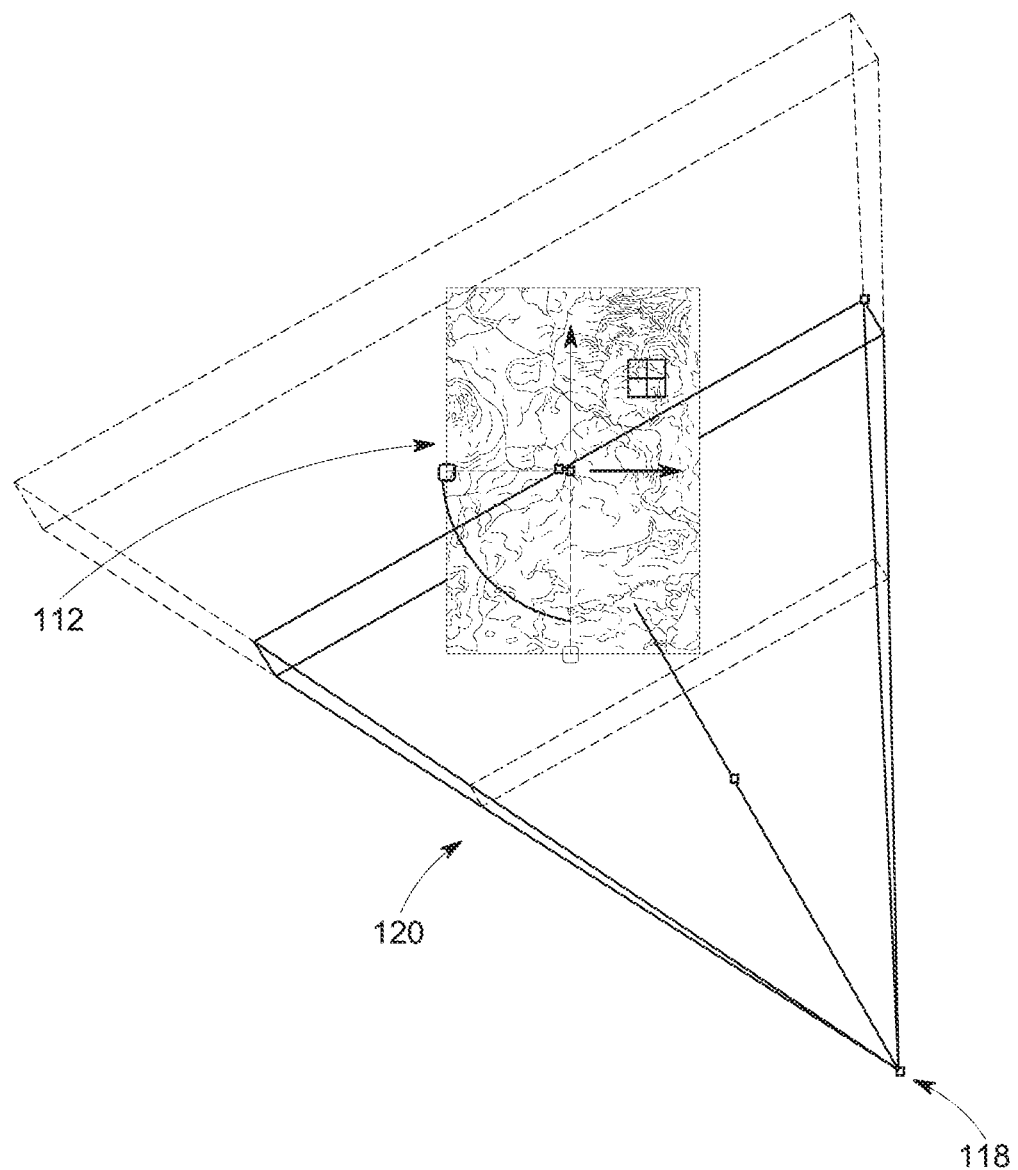
FIG. 6 depicts the surface of FIG. 3 being rescaled.

As shown in FIGS. 5-6, surface 112 may be rescaled and adjusted in orientation in order to capture a desired appearance from a particular distance and/or angle and for general aesthetic concerns. A camera or viewpoint command 118 is used to find a desired perspective or view of surface 112, a field of view 120 of camera 118 is positioned over a desired place on surface 112. From a top view of surface 112, field of view 120 can be seen on surface 112 and the axes of surface 112 can be reoriented to closely match those of camera 118. Preferably, the z-axis of surface 112 is reduced to 10% of its original value. Then, preferably, all of surface 112 may be scaled down, such as to 0.00001% and centered on 0, 0, 0 with respect to the program's coordinates.

Optionally, an object with more substantial thickness may be created by dividing surface 112 by vertical planes and then adding space between the divided sections. In a preferred embodiment, the space added between divided sections may be about 0.8 mm, and a flat surface is added to fill in the new space, and to create a thicker object from surface 112.

Figure 7:
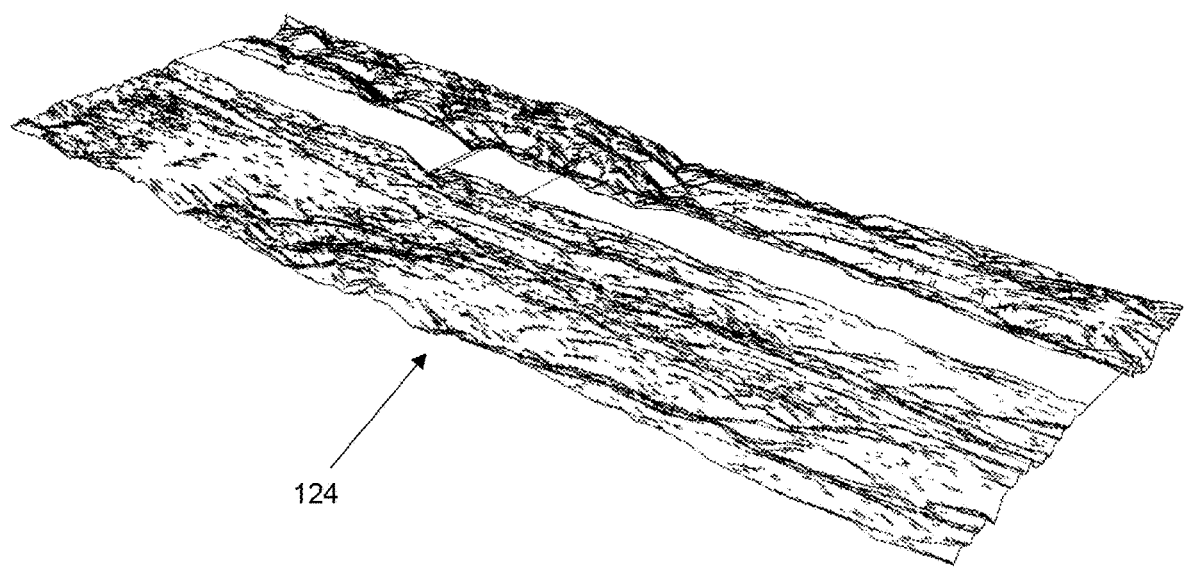
FIG. 7 depicts the rescaled, reoriented surface of FIG. 3 after being split and having flat surfaces added.

Rescaled and re-oriented surface 112 forms an object 124 that has been cut or sliced as shown for example in FIG. 7. Object 124 is then integrated into or onto and further cut and sliced to be fit with a selected template. Templates are 3D virtual models (or precursors thereof) for base structures for the selected type of jewelry (as shown for example in FIGS. 11-15) and may be customized for shape and other features.

Figure 8:
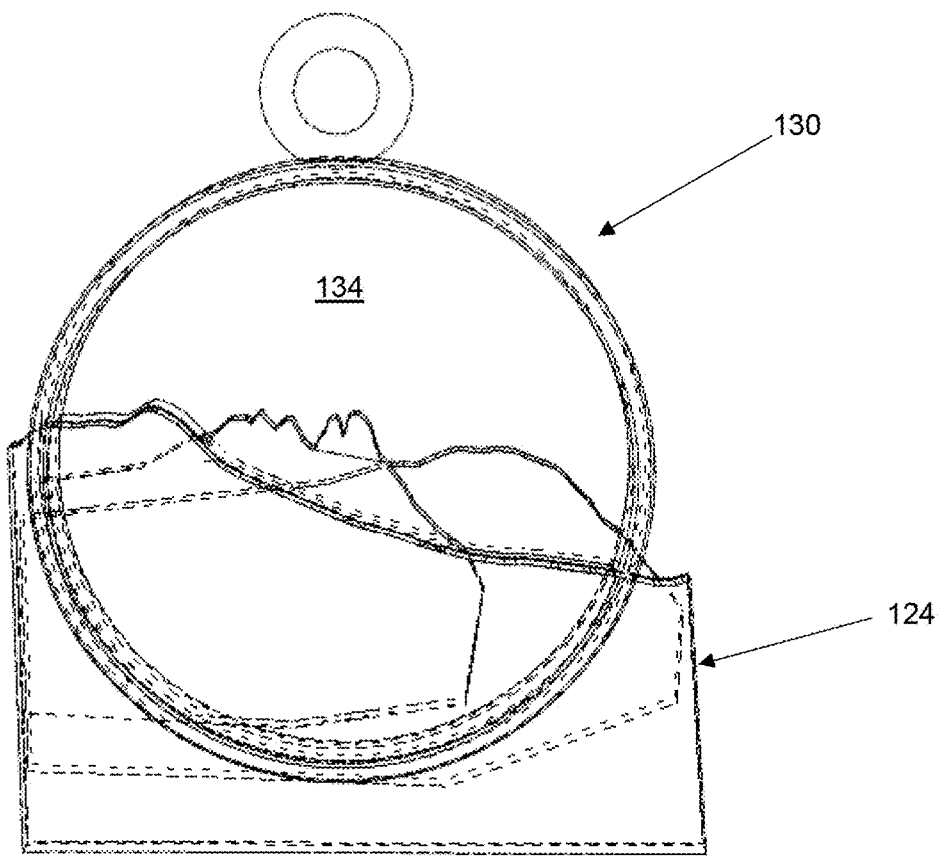
FIG. 8 is a pendant template/frame with a silhouette surface.
Figure 9:
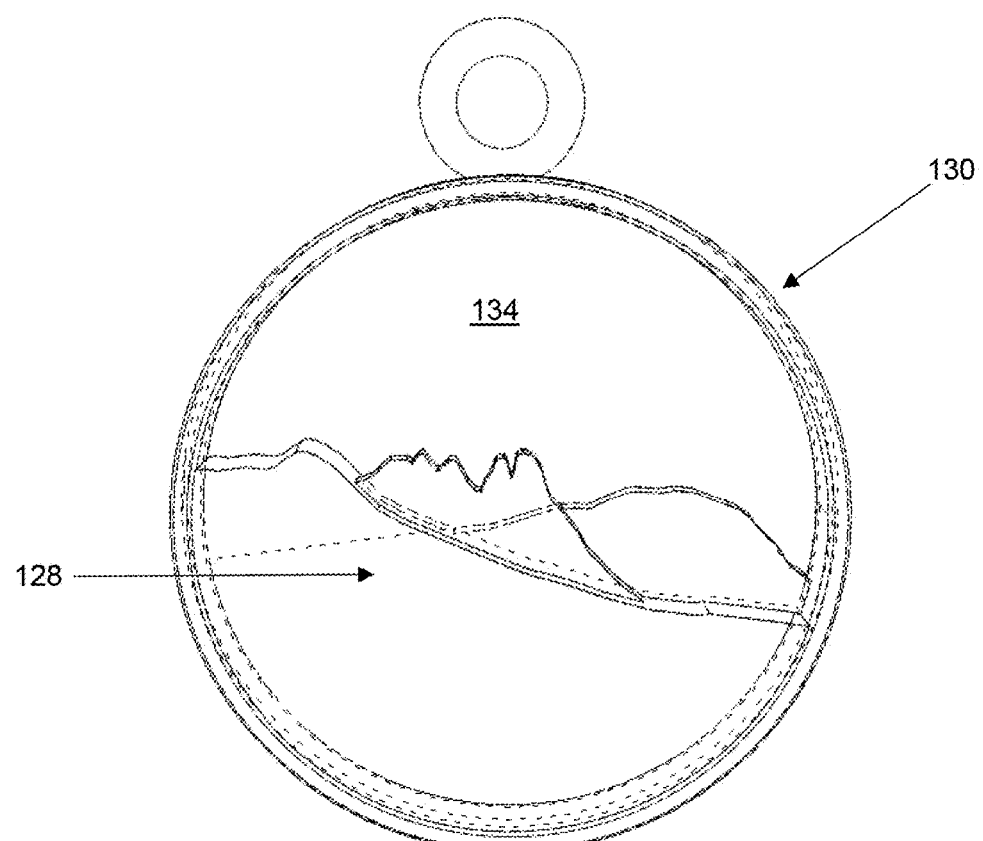
FIG. 9 is the surface/pendant frame of FIG. 8 with surface removed from outside the frame.
Figure 10:
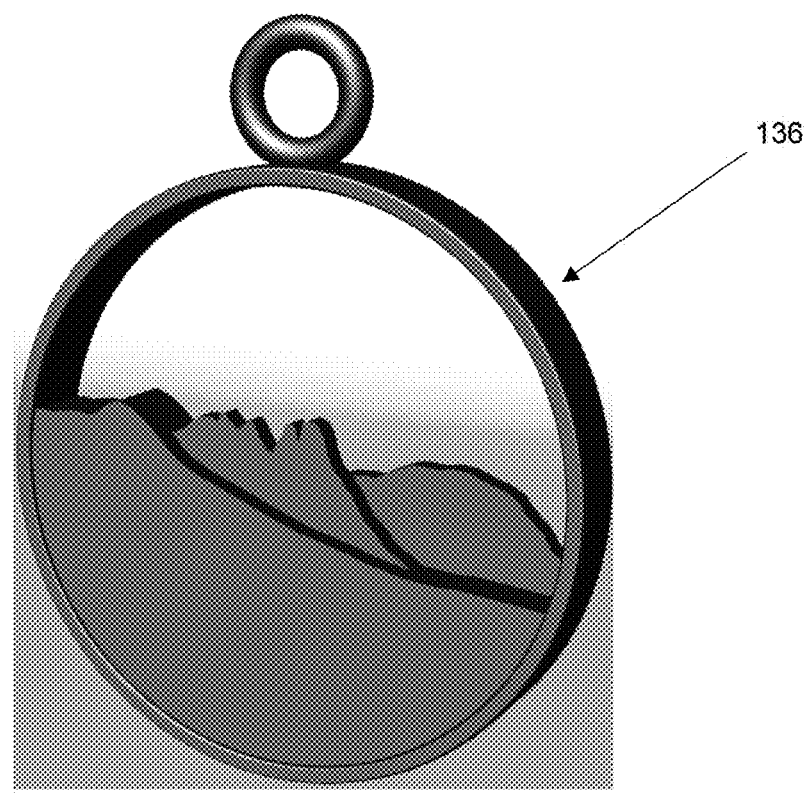
FIG. 10 depicts a model of the surface on a pendant frame in accordance with an embodiment of the present invention.

A frame 130 for a circular pendant is shown in FIGS. 8-9 and may be used to encompass a modified object 128, which may be further sliced or cut in order to fit in frame 130. In an exemplary embodiment, a portion of object 128 contacts frame 130 while a gap or space 134 remains between another portion of object 128 and frame 130 in order to highlight or showcase the silhouette view. Frame 130 may be any suitable shape or configuration, and preferably may be a circle, oval, or rectangle. Frame 130 and object 128 are then merged together to form a 3D model 136 of the piece of jewelry to be formed (as shown in FIG. 10).

Figure 11:
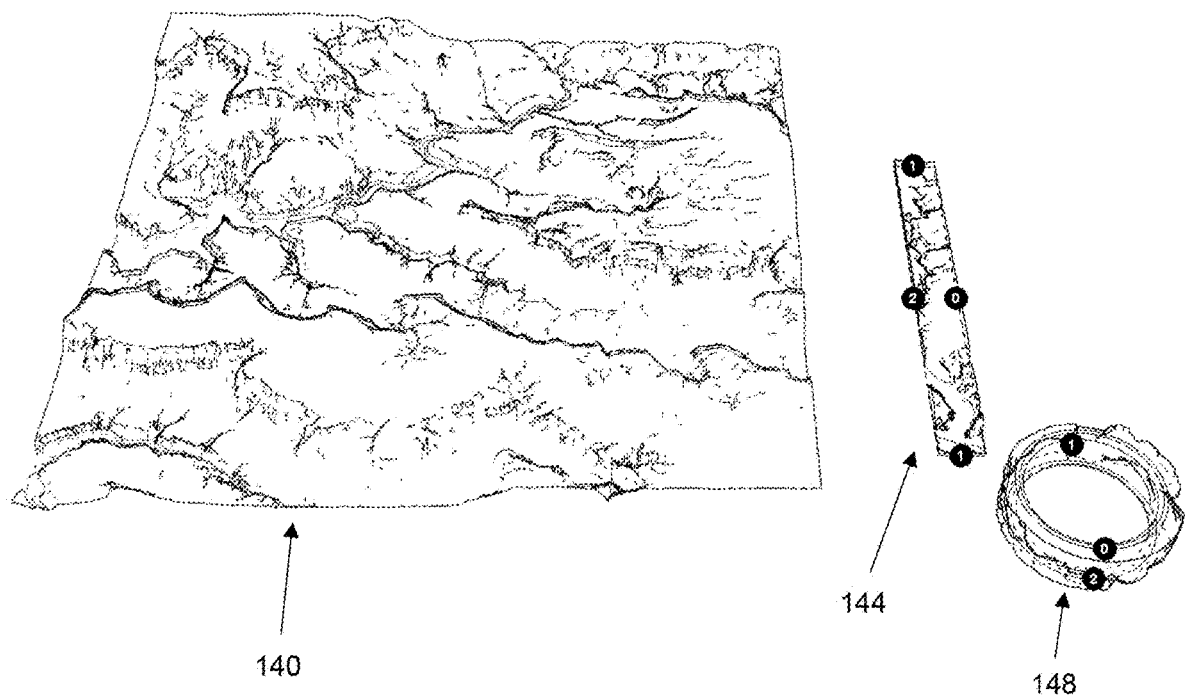
FIG. 11 depicts a surface representation, a ring template, and a model of a ring with a topographic design in accordance with an embodiment of the present invention.

Additional exemplary object types with integrated topographic features are shown in FIGS. 11-15. A topographic surface representation 140 is shown in FIG. 11, and a slice of the surface is taken to produce a template-ready portion 144, which is then merged with a ring template to form a ring model 148.

Figure 12:
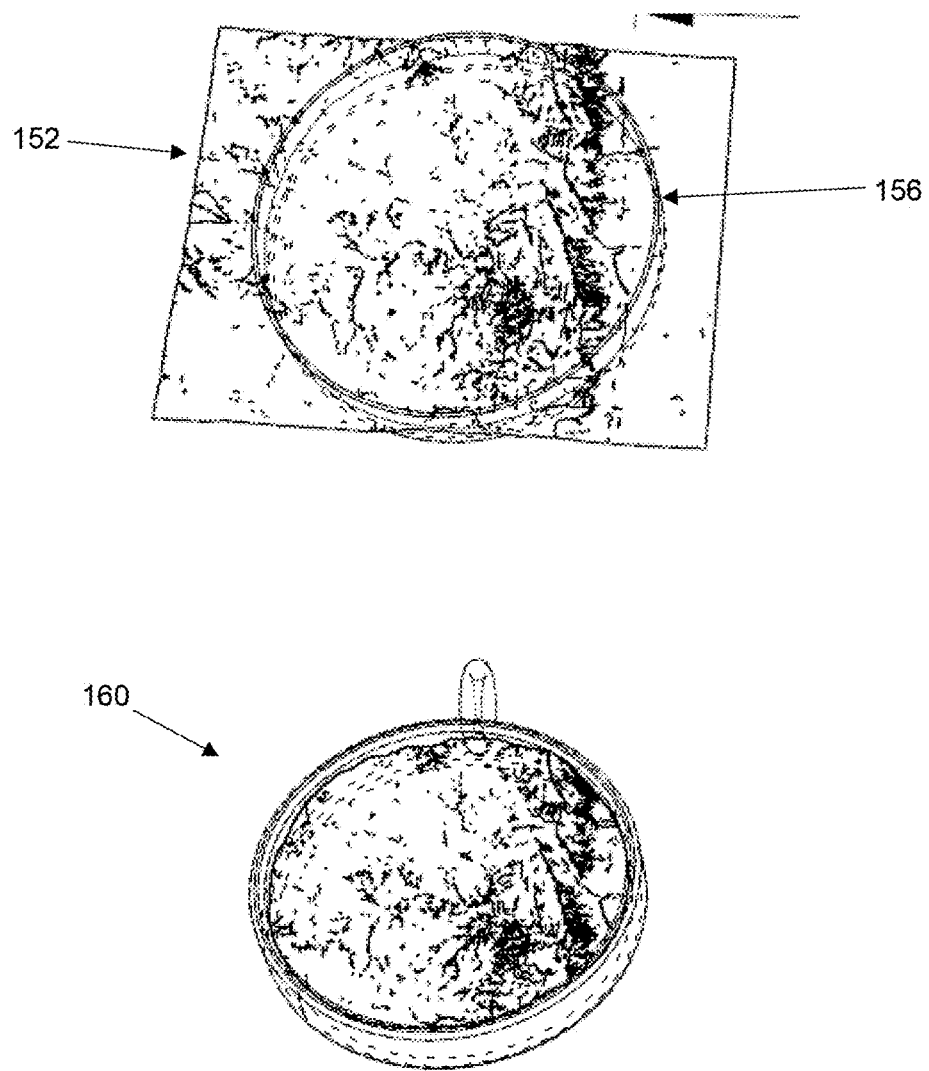
FIG. 12 depicts a surface and circular frame that is merged with a portion of the surface in accordance with an embodiment of the present invention.

Another topographic surface representation 152 is shown in FIG. 12 with a circular pendant frame representation 156 shown enmeshed in surface 152. The portion of surface 152 falling outside frame 156 is removed, forming a topographic ring model 160.

Figure 13:
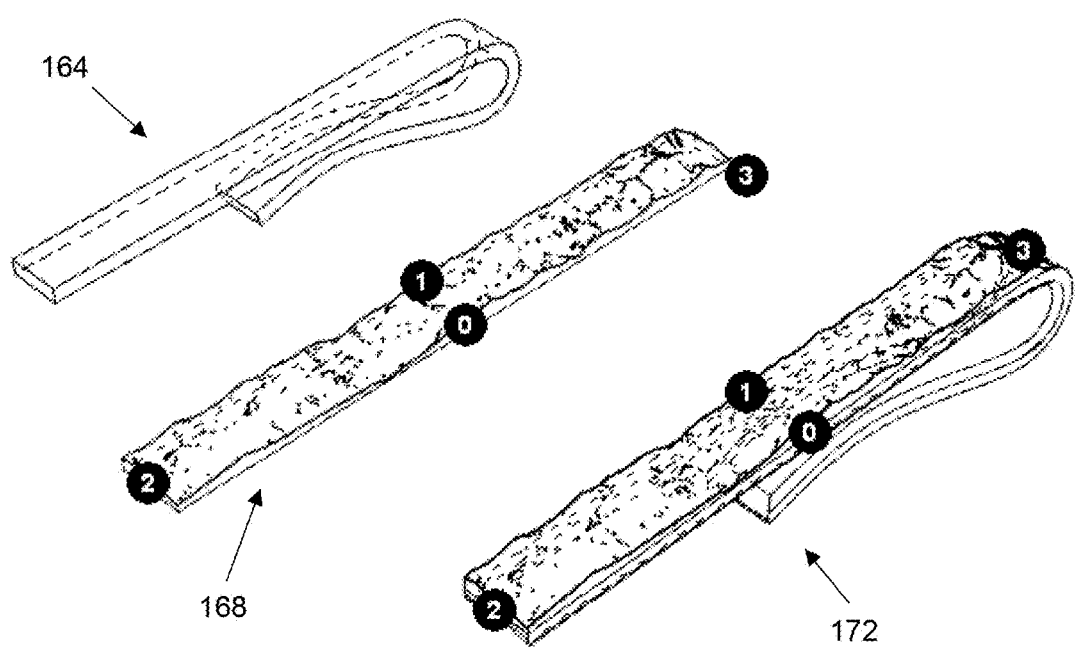
FIG. 13 shows a tie pin template, a topographic surface representation, and a merged tie pin/surface model in accordance with an embodiment of the present invention.

In FIG. 13, a tie pin template 164 is shown along with a topographic surface representation 168 that has been prepared such that the dimensions match tie pin template 164. Then tie pin template 164 and surface 168 are merged to form a topographic tie pin model 172.

Figure 14:
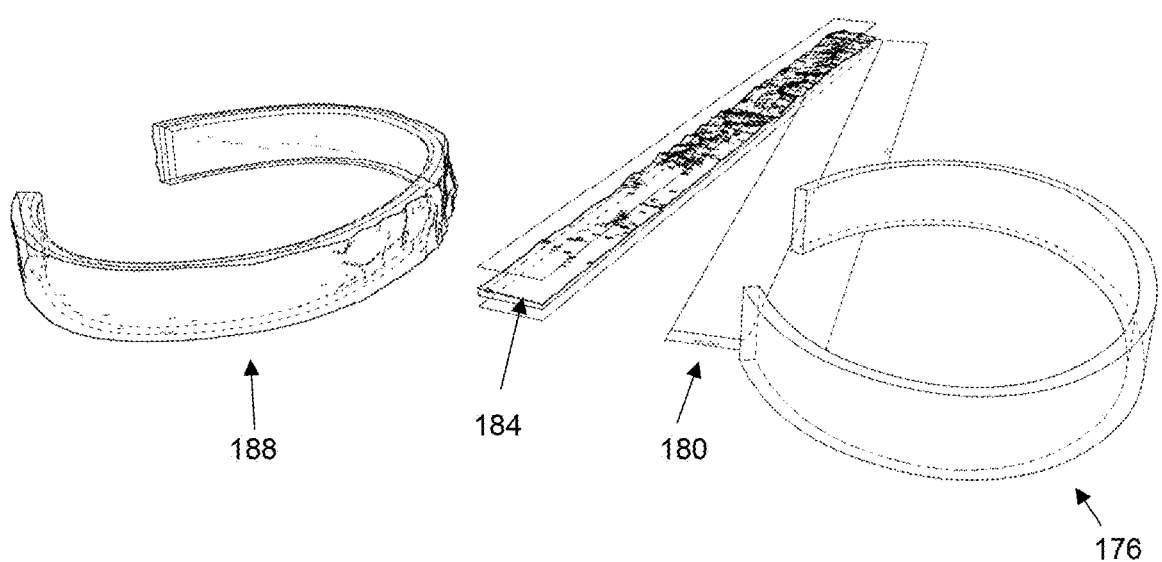
FIG. 14 shows a bracelet template, a topographic surface representation, and a merged bracelet/surface model in accordance with an embodiment of the present invention.

In FIG. 14, a bracelet template 176 is shown, and for clarity template 176 is shown flattened out as bracelet rectangle 180. A topographic surface representation 184 is then merged with rectangle 180 and the resulting object is reshaped into a bracelet to form topographic bracelet model 188.

Figure 15:
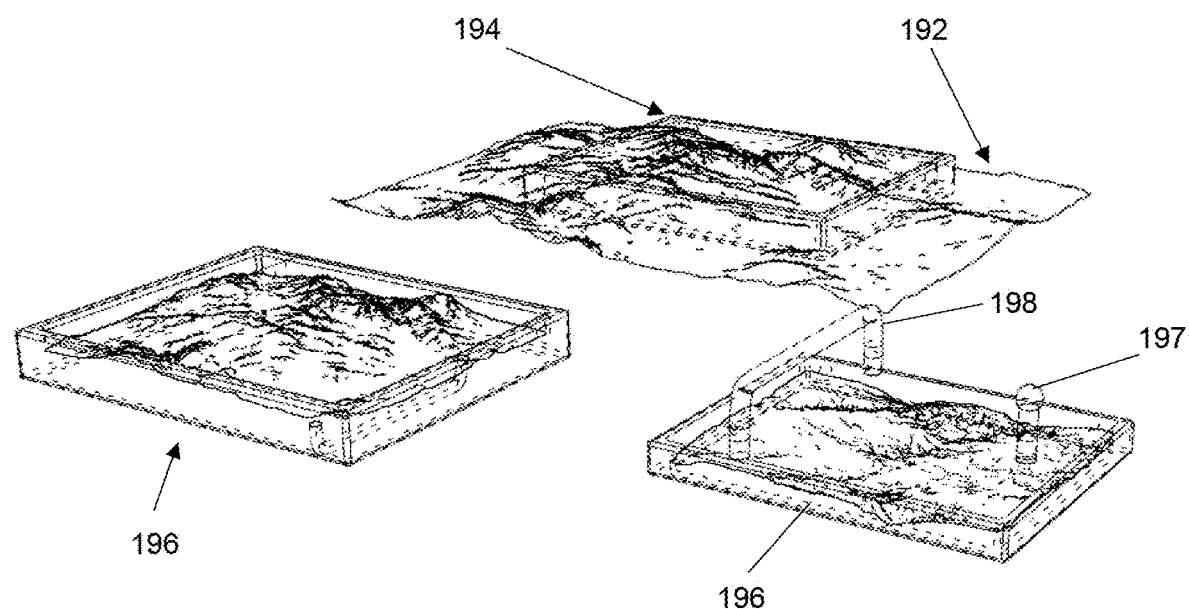
FIG. 15 shows a belt buckle template, a topographic surface representation, and a merged belt buckle/surface model in accordance with an embodiment of the present invention.

In FIG. 15, a topographic surface representation 192 is trimmed by the dimensions of belt buckle template 194, resulting in a topographic belt buckle model 196, to which a first belt securement piece 197 and a second belt securement piece 198 may be added prior to printing and casting.

It may be necessary to add vertical planes to a front and back of a geographic feature so that the frame and feature will be continuous. In order to have a 3D printable file, the models will preferably have only one continuous shell, and any other portions or sections must be joined together. Before preparing a file for printing, the final dimensions can be rechecked to make sure the dimensions are appropriate for the intended purpose of the piece of jewelry.

Figure 16:
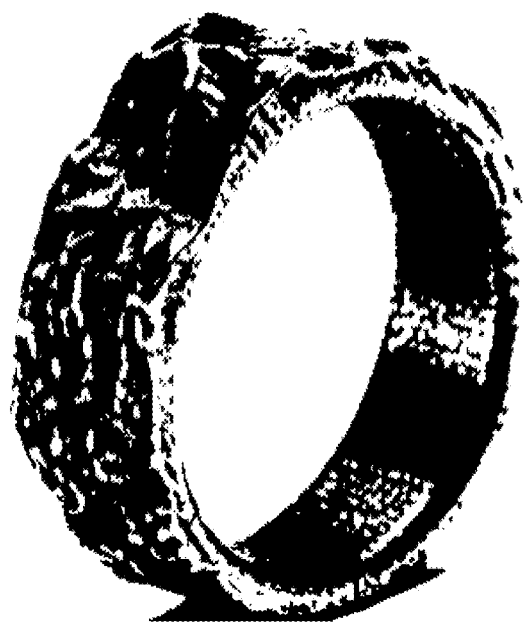
FIG. 16 is a ring with a topographic feature made in accordance with an embodiment of the present invention.
Figure 17:
FIG. 17 is a ring with a silhouette feature made in accordance with an embodiment of the present invention.
Figure 18:
FIG. 18 is a pendant with a topographic feature made in accordance with an embodiment of the present invention.

An STL file of completed 3D model can be exported for 3D printing and jewelry made from the printed object using any appropriate material by any suitable technique, such as lost wax casting, resulting in a piece of jewelry or other accessory, such as those shown in FIGS. 16-18.

In another embodiment, a piece of jewelry may be made that depicts a topographic view of a selected geographic location. In this embodiment, a geographic location is selected and a range of latitude and longitude that encapsulates the location are used to obtain topographic data for that location. An image file of the location is imported to a 3D image program, such as Grasshopper 3D in Rhinoceros, and script 102 uses the data from the image file and the range for the latitude and longitude to create a surface that is topographically representative of the selected geographic location. The adequacy of these ranges may be determined by reference to a map. (In an alternative, an area, such as a rectangular area, may be chosen from a map and the latitude and longitude ranges defining the rectangular area may be used for the latitude and longitude ranges.)

The generated surface image can be viewed in the 3D image program. The surface may be satisfactory, although it may often be necessary to determine whether the desired topography has been captured. If specific features are missing, for example, the latitude and longitude ranges can be adjusted. A frame is used to encompass the extent of the topographic surface as desired. The frame may be any shape, including rectangular or circular. Once the frame is selected and placed on/through the surface, any portions of the surface outside the frame are removed, forming a frame/surface object of the piece of jewelry to be made. In order to have a 3D printable file, the object can have only one continuous shell, and all of the portions or sections of the object must be joined together. Before preparing a file for printing, the final dimensions can be rechecked to make sure the dimensions are appropriate for the intended purpose of the piece of jewelry.

An STL file of the completed object can be exported for 3D printing and jewelry made from an appropriate material by any suitable technique, such as lost wax casting, resulting in jewelry such as a topographic view pendant shown in FIG. 18.

In another embodiment, a ring may be made with either a three dimensional "top view" topographic representation of an area around the outside surface of the ring, an example of which is shown in FIG. 16, or a silhouette view wrapping around the outside surface of the ring, an example of which is shown in FIG. 17.

For a top view ring, a geographic area is selected, preferably a rectangular area with a length-to-side ratio that is close to the length-to-side ratio of a surface area of the outside of the ring to be made. A CAD ring is formed based on the desired size and features of the final product and a representation of a "rolled out" surface area of an outer surface of ring is formed, as shown in FIG. 11. A representation of a topographic surface for the selected geographic location is prepared as described above. Topographic surface can then be scaled and/or cropped to match the width of surface area. In a preferred embodiment, the topographic surface is aligned with the surface area and adjustments can be made for aesthetic reasons and to make sure the seams are going to match up fairly well and so that a first edge and a second edge are on the same plane (so that the ring will be not include a sharp ridge where the edges meet).

The topographic surface is merged on to CAD ring to form a CAD topographic ring. In order to have a 3D printable file, the CAD topographic ring can have only one continuous shell, and so all of the portions or sections must be joined together. Before preparing a file for printing, the final dimensions can be rechecked to make sure the dimensions are appropriate for the intended purpose of the piece of jewelry.

An STL file of the CAD topographic ring can be exported for 3D printing and jewelry made from an appropriate material by any suitable technique, such as lost wax casting, resulting in jewelry such as is shown in FIG. 16.

A silhouette view ring such as the example shown in FIG. 17 can be made in a similar manner. A silhouette representation is created from geographic data generally as described above for silhouette view jewelry and then the silhouette view surface is sized to fit the outer surface area rectangle of a digital ring of a selected size. Preferably, the upper features of the silhouette view will be mostly or all lower than the width of the outer surface area rectangle of the ring. The silhouette view surface may be of varying thickness. Once the parameters are chosen, the topographic surface is merged with the CAD ring, final dimensions are checked, and the file can be exported for 3D printing.

Figure 19A:
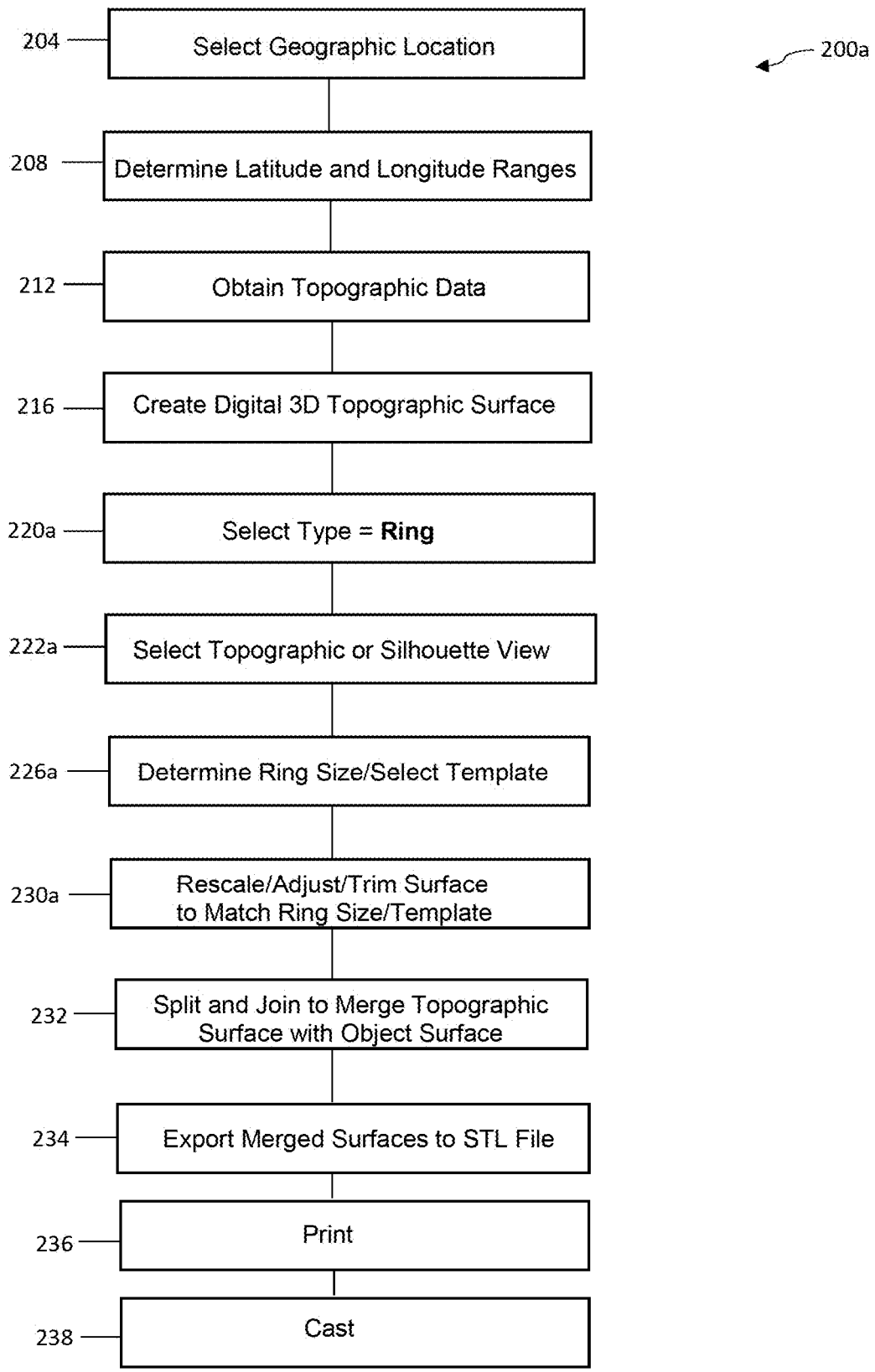
FIGS. 19A-19F are block diagrams showing processes for forming pieces of jewelry in accordance with the present invention.
Figure 19B:
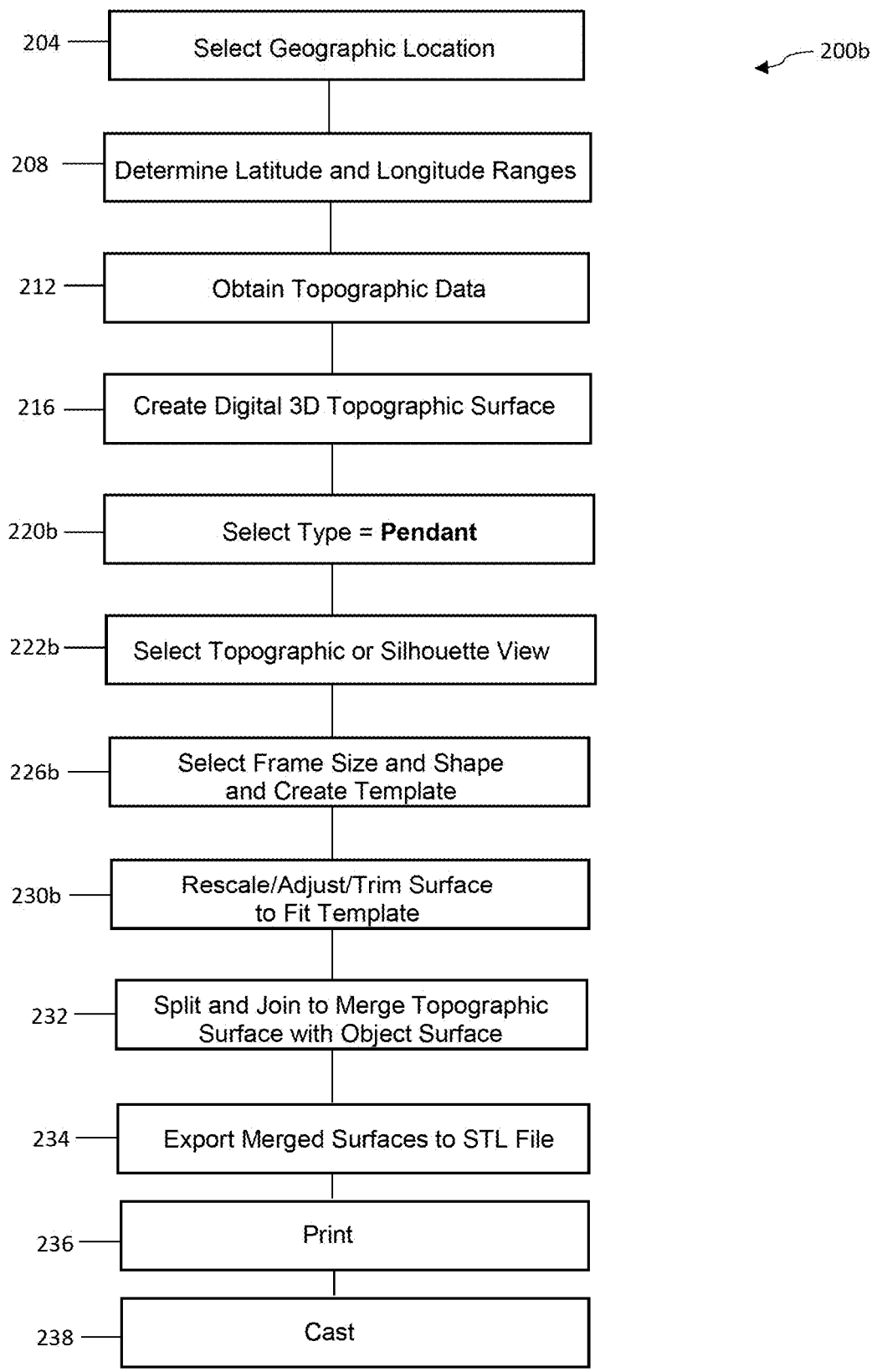
Figure 19C:
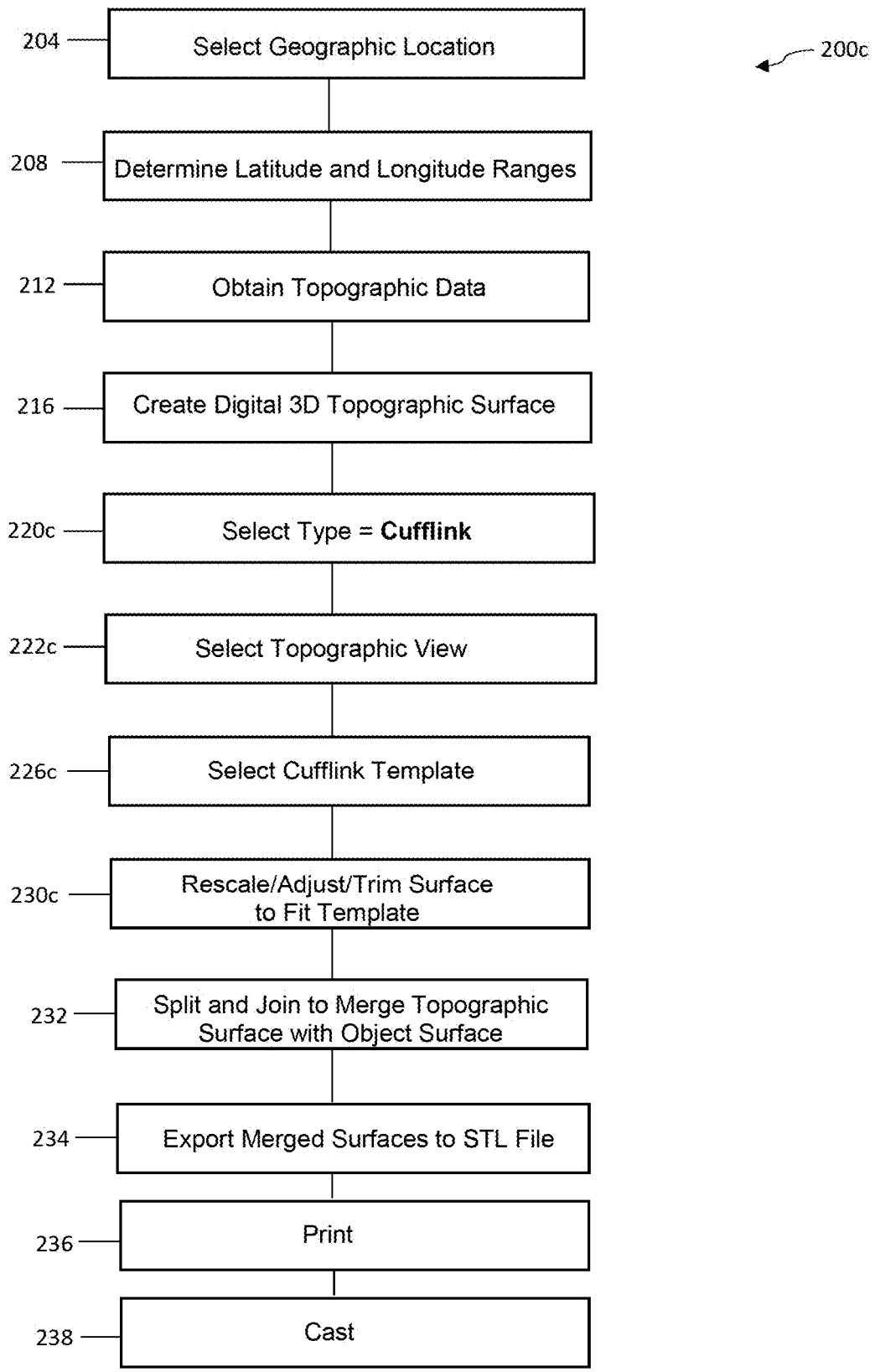
Figure 19D:
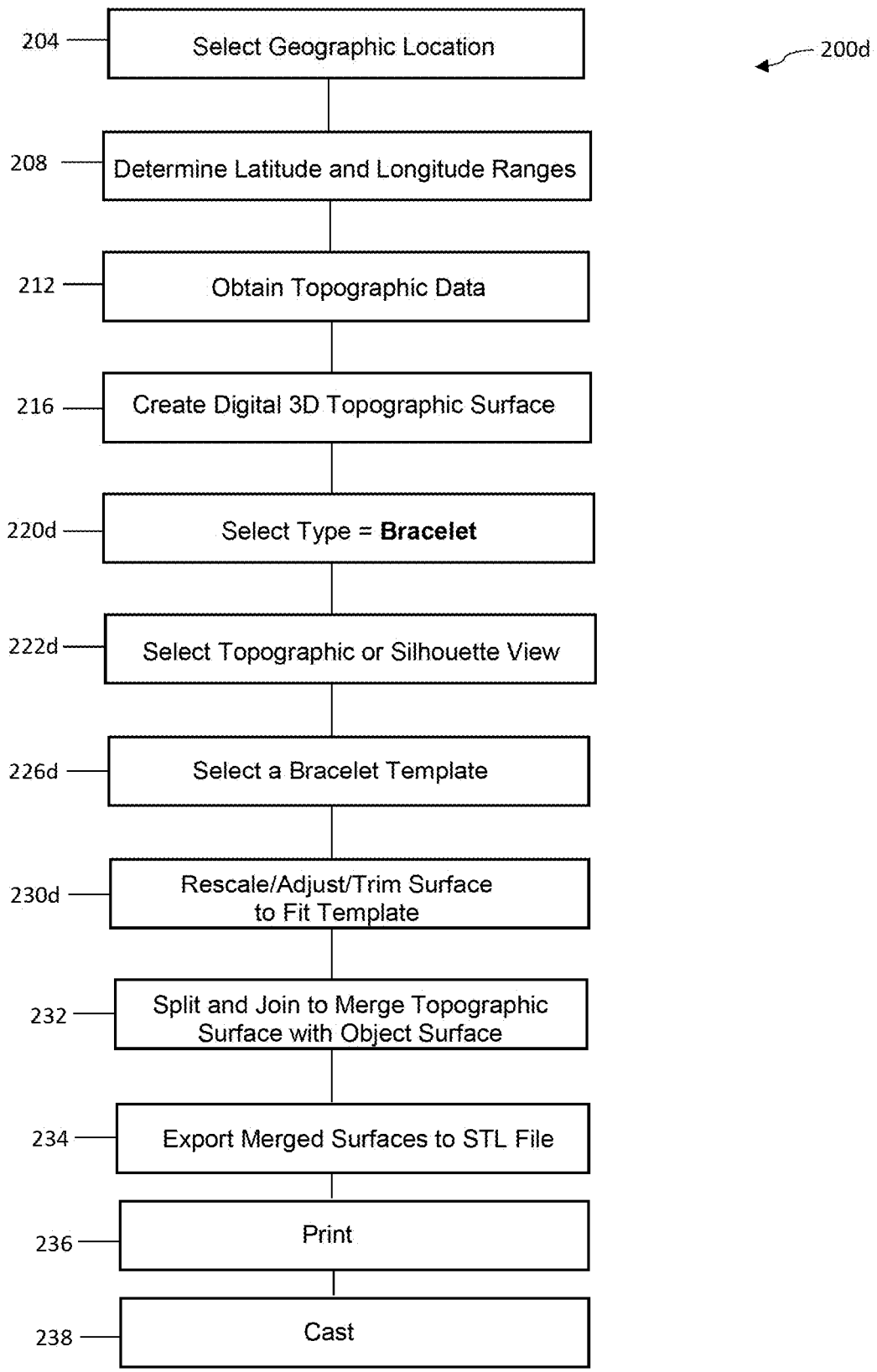
Figure 19E:
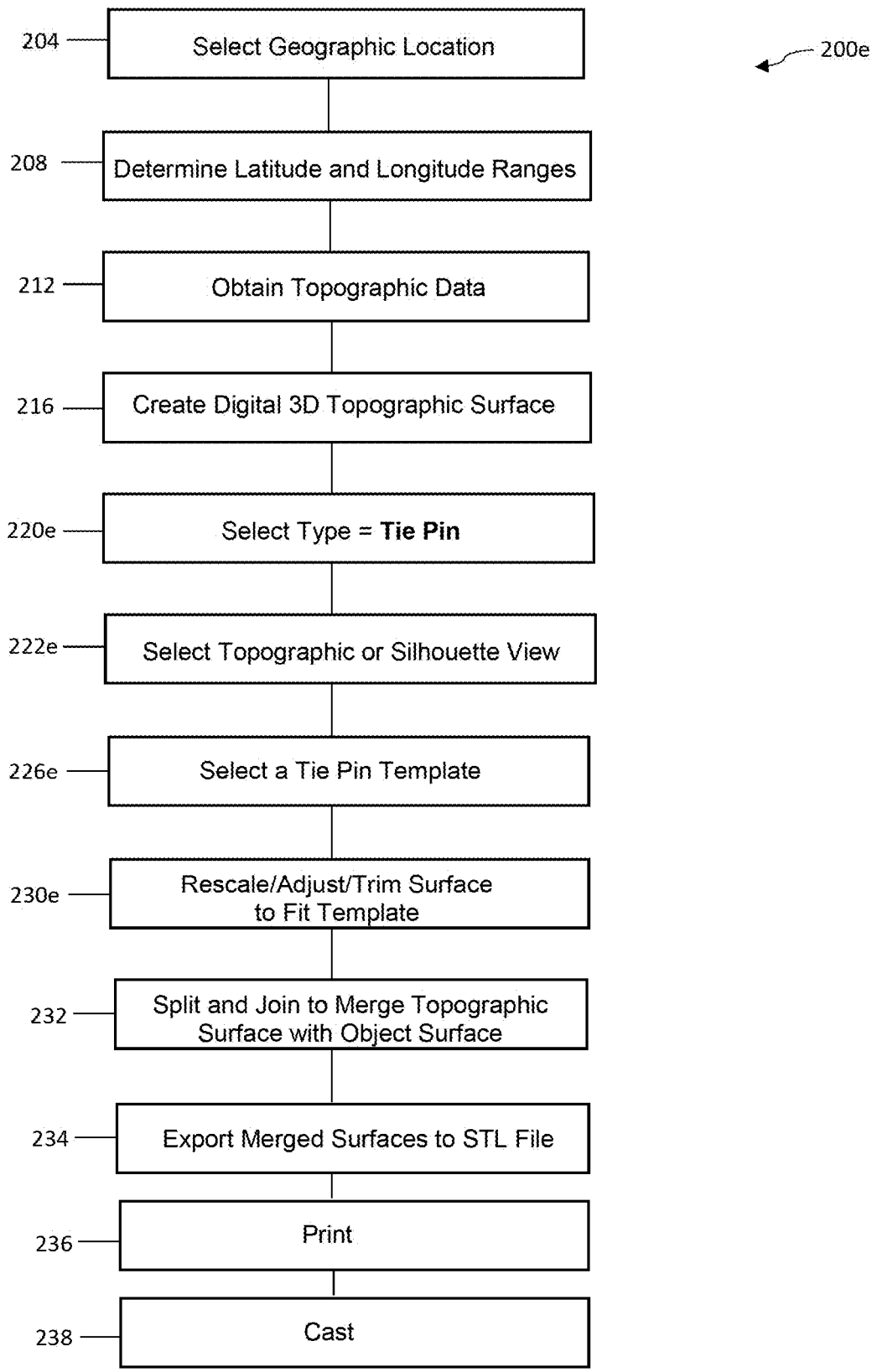
Figure 19F:
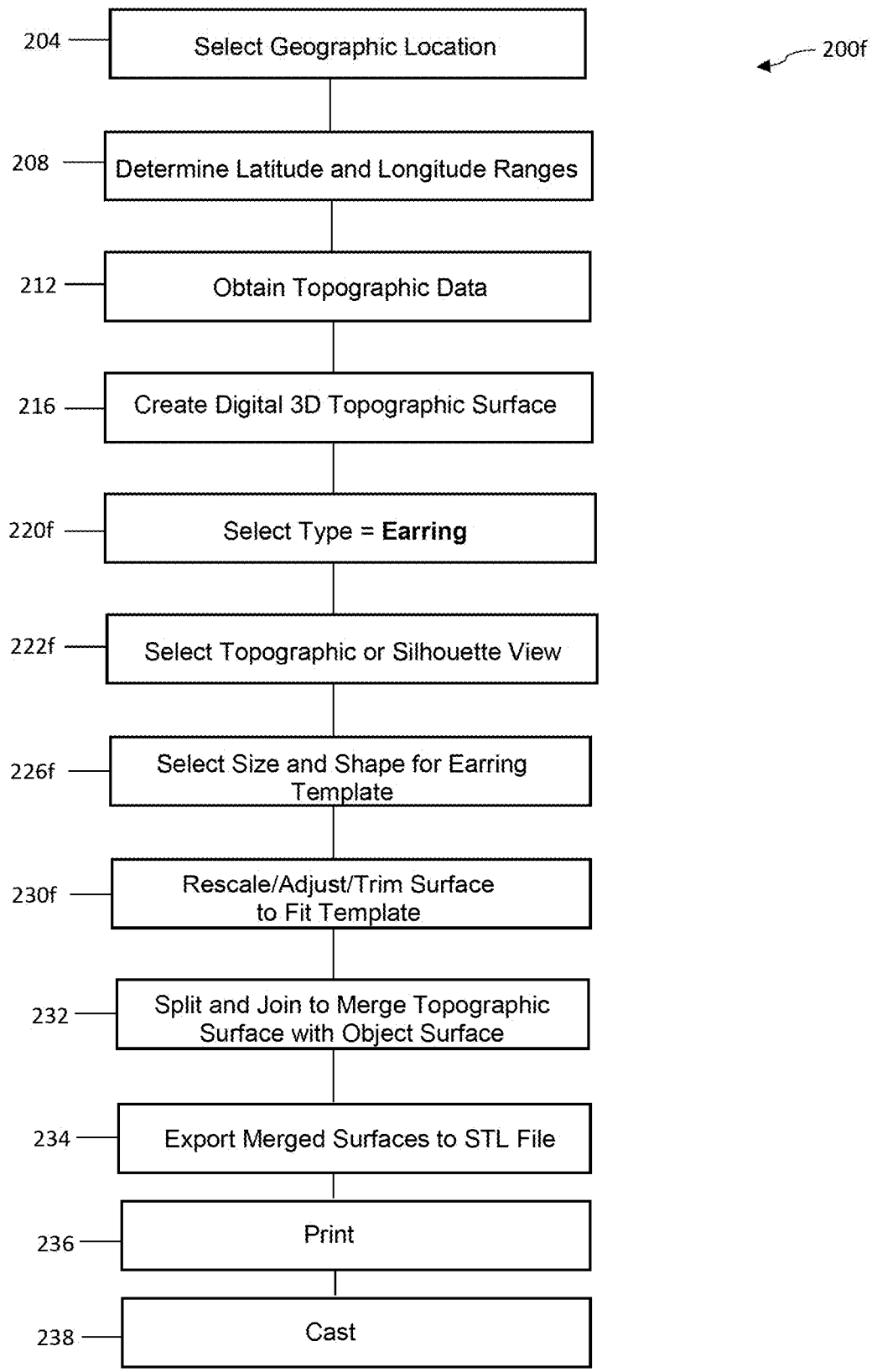

In FIGS. 19A-19F, block diagrams are shown for a jewelry preparation methods 200a-200f for preparing various types of jewelry. Each type includes a step 204 of selecting a geographic location and a step 208 of determining latitude and longitude ranges that capture the desired area to be featured. At step 212, topographic data is retrieved for the determined latitude and longitude range, and then a digital 3D topographic surface that is representative of the selected geographic area is created at step 216. At steps 220a-220f, the type of jewelry or other item to be made is selected. Steps for a ring are shown in FIG. 19A, steps for a pendant are shown in FIG. 19B, steps for a cufflink are shown in FIG. 19C, steps for a bracelet are shown in FIG. 19D, steps for a tie pin are shown in FIG. 19E, and steps for an earring are shown in FIG. 19F.

At steps 222a-222f, as appropriate for the selected type, it is determined whether a topographic or silhouette view is to be made. At steps 226a-226f size and other characteristics for the object template may be selected. At steps 230a-230f, the surface is rescaled, trimmed, and adjusted as needed or desired to match the surface of the object template to which it will be integrated. The digital surface and the virtual object are then merged and made continuous at step 232 and a file containing the merged item is exported to an STL file at step 234. The STL filed is printed with a 3D printer at step 236 and an item of jewelry is cast at step 238.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. A process for the production of a piece of jewelry having a geographic feature comprising the steps of:
    selecting a geographic area;
    preparing a three dimensional surface representative of topography of the area;
    selecting a frame;
    framing a first portion of the surface within the frame;
    removing a second portion of the surface, the removed second portion being outside the frame;
    merging the frame and the first portion of the surface to form a representation of an object of jewelry;
    printing the object of jewelry; and
    casting the piece of jewelry from the printed object.

2. The process according to claim 1, further including selecting a longitude range and a latitude range to select the geographic area.

3. The process according to claim 1, wherein selecting the frame includes selecting the frame associated with forming a pendant.

4. The process according to claim 3, further including leaving a gap between the first portion of the surface and a portion of the frame.

5. The process according to claim 4, wherein the first portion of the surface adjacent the gap is derived from and correlates to a slice of topographical data associated with the geographic area.

6. The process according to claim 1, further including adjusting the topographic surface such that a selected viewpoint is substantially matched.

7. The process according to claim 6, further including rescaling the topographic surface.

8. A process for the production of a piece of jewelry having a geographic feature comprising the steps of:
    selecting a geographic area;
    preparing a three dimensional surface representative of topography of the area;
    selecting a template for the piece of jewelry, the template having a template surface;
    aligning a first portion of the topographic surface with the template surface;
    removing a second portion of the topographic surface, the removed second portion being beyond the template surface when the first portion of the topographic surface is aligned with the template surface;
    merging the template and the first portion of the topographic surface to form a representation of an object of jewelry;
    printing the object of jewelry; and
    casting the piece of jewelry from the printed object.

9. The process according to claim 8, further including adjusting the topographic surface such that a selected viewpoint is substantially matched.

10. The process according to claim 9, further including resealing the topographic surface.

11. The process according to claim 8, wherein the selected template is for a ring.

12. The process according to claim 11, further including connecting a first end of the template to a second end of the template to form a representation of the ring such that features of the first portion of the topographic surface extend outwardly from the ring.

13. The process according to claim 11, wherein the template surface has a first edge and a second edge, and wherein the first portion of the topographic surface extends from the first edge toward the second edge to form a silhouette encircling the template surface.

* * * * *